United States Patent
Otera

(10) Patent No.: US 9,673,372 B2
(45) Date of Patent: Jun. 6, 2017

(54) ACTUATOR DEVICE AND MANUFACTURING METHOD FOR ACTUATOR DEVICE

(71) Applicant: MURATA MANUFACTURING CO., LTD., Kyoto (JP)

(72) Inventor: Shozo Otera, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 370 days.

(21) Appl. No.: 14/186,948

(22) Filed: Feb. 21, 2014

(65) Prior Publication Data

US 2014/0167570 A1 Jun. 19, 2014

Related U.S. Application Data

(63) Continuation of application No. PCT/JP2012/070592, filed on Aug. 13, 2012.

(30) Foreign Application Priority Data

Aug. 24, 2011 (JP) ................... 2011-182308

(51) Int. Cl.
*H01L 41/047* (2006.01)
*H01L 41/293* (2013.01)
(Continued)

(52) U.S. Cl.
CPC ...... *H01L 41/0471* (2013.01); *H01L 41/0472* (2013.01); *H01L 41/0474* (2013.01);
(Continued)

(58) Field of Classification Search
CPC .................................................. H01L 41/047
(Continued)

(56) References Cited

U.S. PATENT DOCUMENTS 6,208,065 B1 * 3/2001 Ueyama ............... H01L 41/083
310/311
2010/0066212 A1 * 3/2010 Denneler ............... H01L 41/29
310/363

FOREIGN PATENT DOCUMENTS

JP 30-10538 Y1 7/1955
JP 5-087974 U 11/1993
(Continued)

OTHER PUBLICATIONS

International Search Report; PCT/JP2012/070592; Sep. 18, 2012.
Written Opinion of the International Searching Authority; PCT/JP2012/070592; Sep. 18, 2012.

*Primary Examiner* — Derek Rosenau
(74) *Attorney, Agent, or Firm* — Studebaker & Brackett PC

(57) ABSTRACT

An actuator device and a manufacturing method for the actuator device with which an outer electrode electrically connected to an inner electrode can be reliably formed even when using a film made of an electrostrictive material. An actuator device includes a plurality of stacked electrostrictive films each of which is made of an electrostrictive material and includes inner electrodes formed on one surface or both surfaces of the film. Lead electrodes are formed to be led out respectively from the inner electrodes toward the outside of the electrostrictive film 31. At least one cut portion is formed in each of the lead electrodes, and conductive ink is applied to the cut portion. The conductive ink reaches, from the cut portions, the lead electrodes formed on the electrostrictive film.

8 Claims, 5 Drawing Sheets

(51) Int. Cl.
*H01L 41/09* (2006.01)
*H01L 41/277* (2013.01)
*H01L 41/314* (2013.01)
*H01L 41/193* (2006.01)

(52) U.S. Cl.
CPC ............ *H01L 41/09* (2013.01); *H01L 41/277* (2013.01); *H01L 41/293* (2013.01); *H01L 41/314* (2013.01); *H01L 41/193* (2013.01)

(58) Field of Classification Search
USPC ........................................ 310/365, 366, 369
See application file for complete search history.

(56) References Cited

FOREIGN PATENT DOCUMENTS

| | | | |
|---|---|---|---|
| JP | 06-085465 | A | 3/1994 |
| JP | 2002-050534 | A | 2/2002 |
| JP | 2003-199365 | A | 7/2003 |
| JP | 2008-078640 | A | 4/2008 |
| JP | 2012-142478 | A | 7/2012 |

* cited by examiner

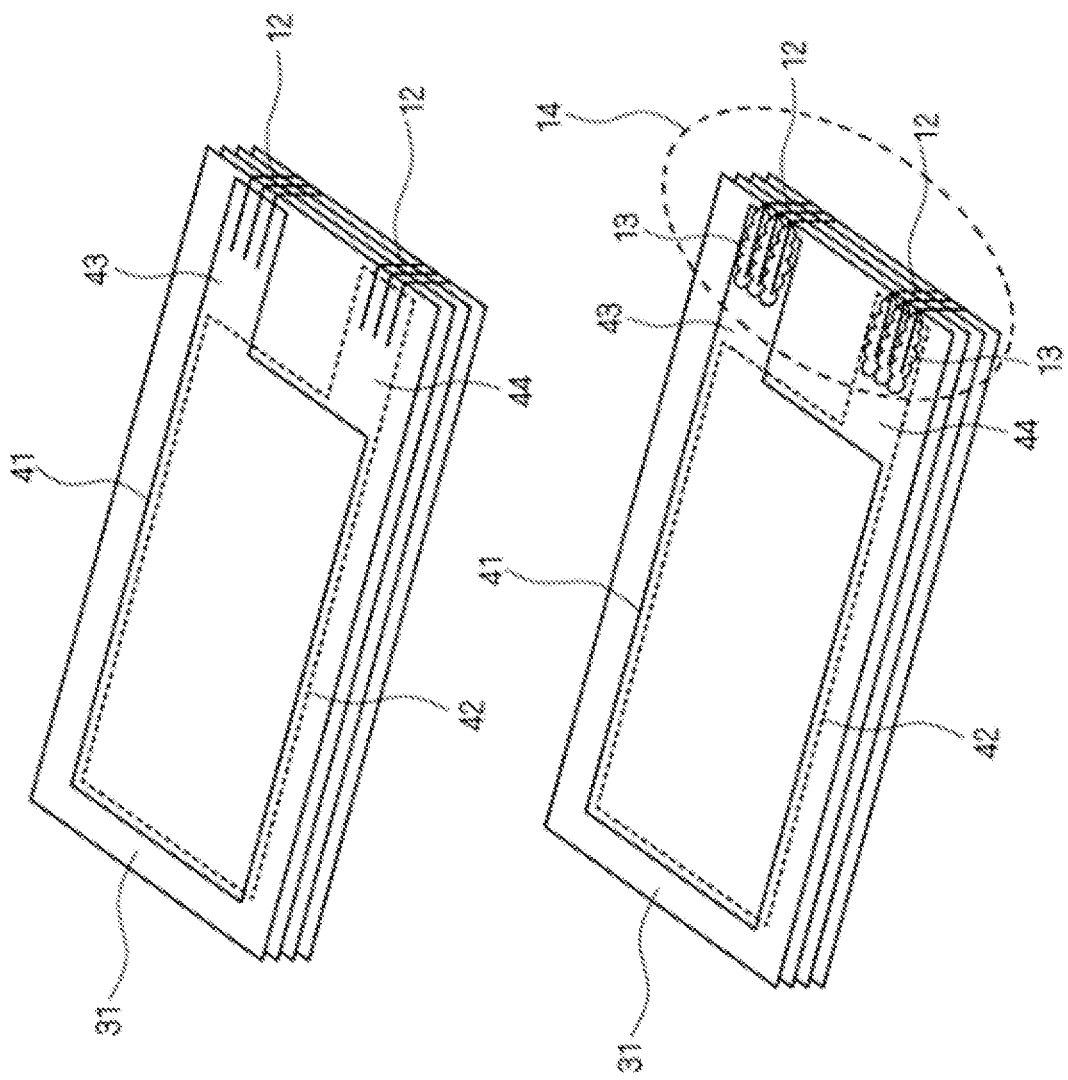

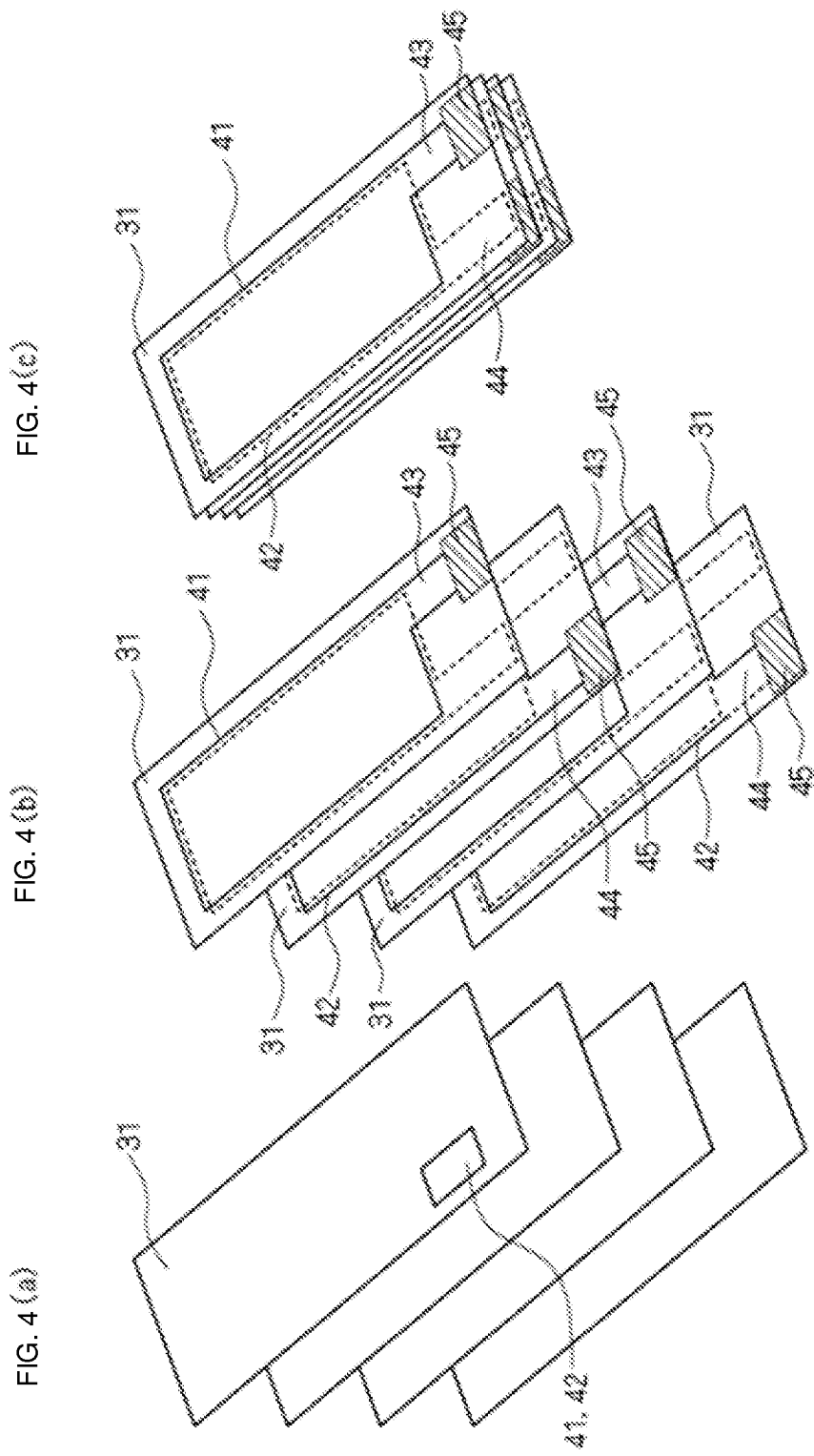

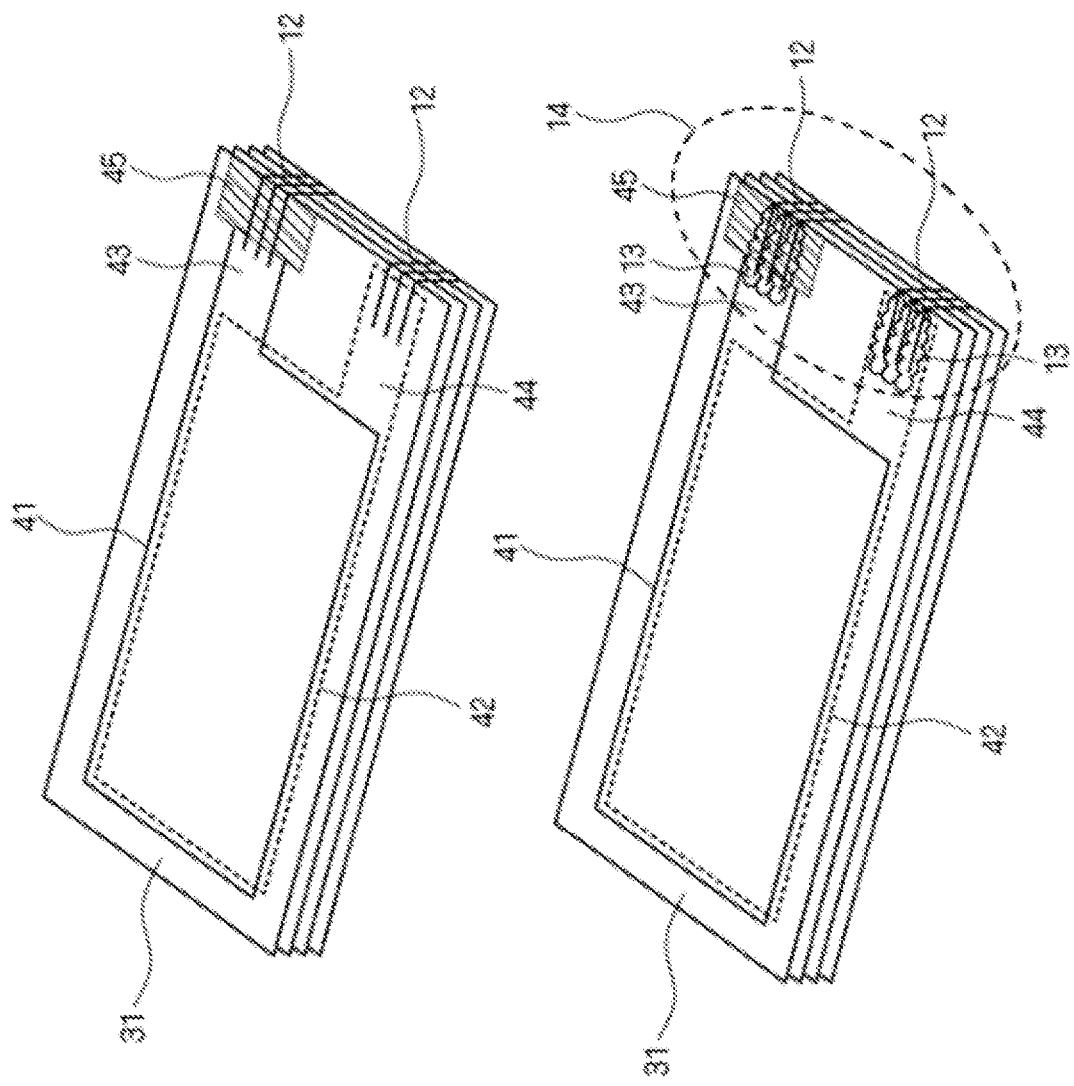

ACTUATOR DEVICE AND MANUFACTURING METHOD FOR ACTUATOR DEVICE

CROSS REFERENCE TO RELATED APPLICATIONS

This application claims benefit of priority to Japanese Patent Application No. 2011-182308 filed on Aug. 24, 2011, and to International Patent Application No. PCT/JP2012/070592 filed on Aug. 13, 2012, the entire content of each of which is incorporated herein by reference.

TECHNICAL FIELD

The present technical field relates to an actuator device in which films made of an electrostrictive material are stacked, and also relates to a manufacturing method for the actuator device.

BACKGROUND

In the fields of medical equipment, industrial robots, and so on, sophisticated motions are required in many cases. Accordingly, development of an actuator device having a smaller size, lighter weight, and higher flexibility is an urgent issue in the relevant art. From that point of view, many actuator devices have been developed including, for example, the type that two sheets each made of an electrostrictive material are bonded to each other and the bonded sheets are used as a flexible member.

Recently, an actuator device including stacked films made of an electrostrictive material has also been developed with an intent to further reduce the device weight. In such an actuator device, an outer electrode for connecting the actuator device to an external device, etc. is formed by T-connecting electrodes, which are exposed from a divided surface. A stack of plural films, made of an electrostrictive material, are secured to one another using a conductive paste, for example.

When manufacturing the above-mentioned actuator device, a method of manufacturing a ceramic substrate can be employed in a similar manner. For example, Japanese Unexamined Patent Application Publication No. 06-085465 discloses a method of manufacturing a module substrate by forming division grooves in a multilayer body in which ceramic sheets (green sheets) including conductor patterns formed thereon, and by cutting the multilayer body into substrates each having a desired size. In Japanese Unexamined Patent Application Publication No. 06-085465, lateral surface electrodes (outer electrodes) are formed by making the wiring patterns provided inside the cut substrate exposed from a lateral surface of the substrate through vias and outer connection electrodes, coating platings over the exposed wiring patterns, and by printing a conductive paste into through-holes, etc.

SUMMARY

Technical Problem

However, when the films made of the electrostrictive material are used instead of the sheets made of the electrostrictive material, the film thickness is as thin as several μm or less. This causes the problem that a difficulty arises in dividing the films in a way providing clean sections and further in reliably forming an outer electrode (lateral surface electrode) electrically connected to an inner electrode with a T-connection.

In the case of sheets being rigid and having a certain thickness like ceramic sheets, an inner electrode can be surely exposed from a divided surface of a stack of the sheets by withdrawing the inner electrode from the divided surface (lateral surface) with, e.g., polishing carried out after division of the stacked sheets. In the case of soft and thin films, however, it is difficult to divide a stack of the films in a way providing a clean section, and there is a possibility that the inner electrode is not exposed from the divided surface. When an organic material is used for the inner electrode instead of using a metal, it is more difficult to withdraw the inner electrode from the divided surface, and there is a possibility that the outer electrode (lateral surface electrode) electrically connected to the inner electrode with a T-connection cannot be reliably formed. Furthermore, when the T-connection between the electrodes is insufficient, a problem arises in that when a large electric field is generated between the outer electrode and the inner electrode, minute discharge is caused even by a slight connection failure, and deterioration of the electrodes progresses.

The present disclosure has been accomplished in view of the above-described situations in the art, and an object of the present disclosure is to provide an actuator device and a manufacturing method for the actuator device with which an outer electrode electrically connected to an inner electrode can be reliably formed even when a film made of an electrostrictive material is used.

Solution to Problem

To achieve the above-mentioned object, the present disclosure provides an actuator device including a plurality of stacked films each of which is made of an electrostrictive material and includes inner electrodes formed on one surface or both surfaces of the film, wherein lead electrodes are formed to be led out respectively from the inner electrodes toward outside of the film, at least one cut portion is formed in the lead electrode, and conductive ink is applied to the cut portion.

With the features described above, the plural films each made of the electrostrictive material and including the inner electrodes formed on one surface or both surfaces of the film are stacked. The lead electrodes are formed to be led out respectively from the inner electrodes toward the outside of the film, at least one cut portion is formed in the lead electrode, and the conductive ink is applied to the cut portion. Since the conductive ink is applied to the cut portion, the conductive ink reaches each set of stacked lead electrodes from the cut portion. By heat-hardening the applied conductive ink, the set of stacked lead electrodes can be interconnected in a stacking direction of the films, and an outer electrode electrically connected to the corresponding inner electrode can be reliably formed.

In the actuator device according to the present disclosure, preferably, the lead electrodes are formed as electrodes having different polarities, the electrodes being not overlapped with each other in a stacking direction of the films, and the cut portion is formed in each of the lead electrodes having different polarities.

With the features described above, since the lead electrodes are formed as electrodes having different polarities, the electrodes being not overlapped with each other in the stacking direction of the films, and the cut portion is formed in each of the lead electrodes having different polarities, it is possible to form outer electrodes having different positive and negative polarities, for example, and to avoid the outer electrodes having different positive and negative polarities from short-circuiting.

In the actuator device according to the present disclosure, preferably, a holding member serving to hold the conductive ink is arranged in overlying relation to each of the lead electrodes having different polarities between adjacent ones of the plural stacked films.

With the feature described above, since the holding member serving to hold the conductive ink is arranged in overlying relation to each of the lead electrodes having different polarities between adjacent ones of the plural stacked films, respective sets of stacked lead electrodes having different polarities can be reliably interconnected per set in the stacking direction of the films through the holding members, and the outer electrodes electrically connected to the corresponding inner electrodes can be reliably formed. Furthermore, since the holding member is arranged in overlying relation to each of the lead electrodes having different polarities between adjacent ones of the plural stacked films, the lead electrodes having different positive and negative polarities can avoid short-circuiting. In addition, thicknesses of the lead electrodes can be increased, and the cut portions can be easily formed. As a result, a thickness of each outer electrode can be increased, and durability of the outer electrode can be improved.

In the actuator device according to the present disclosure, preferably, the holding member is arranged in contact with an outer periphery of the film at a side where the lead electrodes are formed.

With the feature described above, since the holding member is arranged in contact with the outer periphery of the film at the side where the lead electrodes are formed, the thicknesses of the lead electrodes can be increased, and the cut portions can be easily formed. As a result, the thickness of each outer electrode can be increased, and the durability of the outer electrode can be improved.

To achieve the above object, the present disclosure further provides a manufacturing method for an actuator device, the method comprising the steps of stacking a plurality of films each of which is made of an electrostrictive material and includes inner electrodes formed on one surface or both surfaces of the film, forming lead electrodes to be led out respectively from the inner electrodes toward outside of the film, forming at least one cut portion in the lead electrode, and applying conductive ink to the cut portion.

With the features described above, the plural films each made of the electrostrictive material and including the inner electrodes formed on one surface or both surfaces of the film are stacked. The lead electrodes are formed to be led out respectively from the inner electrodes toward the outside of the film, at least one cut portion is formed in the lead electrode, and the conductive ink is applied to the cut portion. Since the conductive ink is applied to the cut portion, the conductive ink reaches each set of stacked lead electrodes from the cut portion. By heat-hardening the applied conductive ink, the set of stacked lead electrodes can be interconnected in the stacking direction of the films, and an outer electrode electrically connected to the corresponding inner electrode can be reliably formed.

In the manufacturing method for the actuator device according to the present disclosure, preferably, the lead electrodes are formed as electrodes having different polarities, the electrodes being not overlapped with each other in a stacking direction of the films, and the cut portion is formed in each of the lead electrodes having different polarities.

With the features described above, since the lead electrodes are formed as electrodes having different polarities, the electrodes being not overlapped with each other in the stacking direction of the films, and the cut portion is formed in each of the lead electrodes having different polarities, it is possible to form outer electrodes having different positive and negative polarities, for example, and to avoid the outer electrodes having different positive and negative polarities from short-circuiting.

In the manufacturing method for the actuator device according to the present disclosure, preferably, a holding member serving to hold the conductive ink is arranged in overlying relation to each of the lead electrodes having different polarities between adjacent ones of the plural stacked films.

With the feature described above, since the holding member serving to hold the conductive ink is arranged in overlying relation to each of the lead electrodes having different polarities between adjacent ones of the plural stacked films, respective sets of stacked lead electrodes having different polarities can be reliably interconnected per set in the stacking direction of the films through the holding members, and the outer electrodes electrically connected to the corresponding inner electrodes can be reliably formed. Furthermore, since the holding member is arranged in overlying relation to each of the lead electrodes having different polarities between adjacent ones of the plural stacked films, the lead electrodes having different positive and negative polarities can avoid short-circuiting. In addition, thicknesses of the lead electrodes can be increased, and the cut portions can be easily formed. As a result, a thickness of each outer electrode can be increased, and the durability of the outer electrode can be improved.

In the manufacturing method for the actuator device according to the present disclosure, preferably, the holding member is arranged in contact with an outer periphery of the film at a side where the lead electrodes are formed.

With the feature described above, since the holding member is arranged in contact with the outer periphery of the film at the side where the lead electrodes are formed, the thicknesses of the lead electrodes can be increased, and the cut portions can be easily formed. As a result, the thickness of each outer electrode can be increased, and the durability of the outer electrode can be improved.

Advantageous Effects of Disclosure

According to the present disclosure having the features described above, since the conductive ink is applied to the cut portion, the conductive ink reaches each set of stacked lead electrodes from the cut portion. By heat-hardening the applied conductive ink, the set of stacked lead electrodes can be interconnected in the stacking direction of the films, and the outer electrode electrically connected to the corresponding inner electrode can be reliably formed.

BRIEF DESCRIPTION OF THE DRAWINGS

FIGS. 3(a) and 3(b) are schematic perspective views illustrating the manufacturing process of the actuator device according to Embodiment 1 of the present disclosure.

FIGS. 4(a) to 4(c) are schematic perspective views illustrating a manufacturing process of an actuator device according to Embodiment 2 of the present disclosure.

FIGS. 5(a) and 5(b) are schematic perspective views illustrating the manufacturing process of the actuator device according to Embodiment 2 of the present disclosure.

DETAILED DESCRIPTION

Embodiments of the present disclosure will be described in detail below with reference to the drawings. It is to be noted that the following embodiments are described in connection with an actuator device, which is formed by stacking a plurality of rectangular electrostrictive films (called also simply "films") made of a high-molecular electrostrictive material. As a matter of course, the shape of each of the stacked electrostrictive films (films) is not limited to a rectangle.

Embodiment 1

Figure 1:
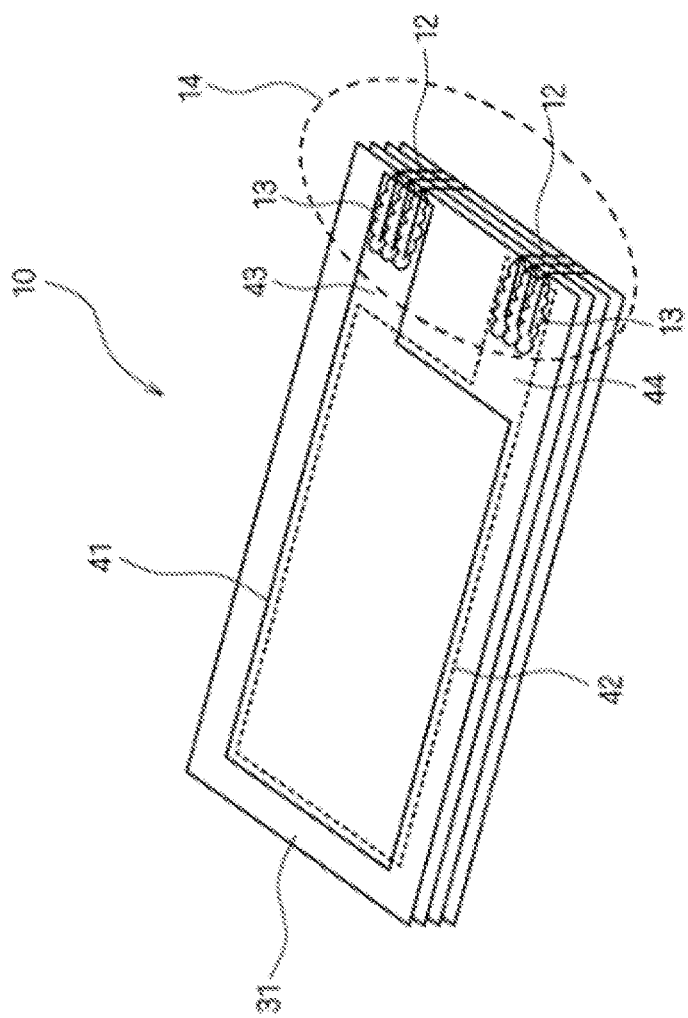
FIG. 1 is a schematic perspective view illustrating a configuration of an actuator device according to Embodiment 1 of the present disclosure.

FIG. 1 is a schematic perspective view illustrating a configuration of an actuator device according to Embodiment 1 of the present disclosure. The actuator device 10 according to Embodiment 1 is formed by stacking a plurality of rectangular electrostrictive films (films) 31 made of a high-molecular electrostrictive material. Conductor patterns 41 and 42 are formed as inner electrodes on front and rear surfaces of each electrostrictive film 31, respectively. Lead electrodes 43 and 44 led out to, e.g., the same side including one side of the rectangular electrostrictive film 31, are formed to extend respectively from the conductor patterns 41 and 42 toward the outside of the rectangular electrostrictive film 31.

A plurality of cut portions 12 are formed in each set of lead electrodes 43 and 44, and conductive ink 13 is applied to the plural cut portions 12. The cut portions 12 are cut from a divided surface of the actuator device 10 in a direction perpendicular to the stacking direction of the electrostrictive films 31 up to a depth not reaching the conductor patterns 41 and 42, i.e., up to a depth not reaching positions from which the lead electrodes 43 and 44 are led out. Therefore, when the conductive ink 13 is impregnated into the cut portions 12, the conductive ink 13 will not reach the conductor patterns 41 and 42, and the conductor patterns 41 and 42 are avoided from short-circuiting.

The conductive ink 13 is impregnated into the cut portions 12 by dipping the cut portions 12 in the conductive ink 13. By heat-hardening the conductive ink 13 impregnated into the cut portions 12, the respective sets of lead electrodes 43 and 44 can be interconnected per set in the stacking direction of the electrostrictive films 31, and an outer electrode 14 electrically connected to the corresponding inner electrode (i.e., the conductor pattern 41 or 42) can be reliably formed.

As a matter of course, the conductive ink 13 seeping out from the cut portions 12 and exposed to the outside may be covered with an Au conductive paste or a Cu conductive paste. The outer electrode 14 having higher robustness can be formed by covering the conductive ink 13 with the conductive paste.

Figure 2C:
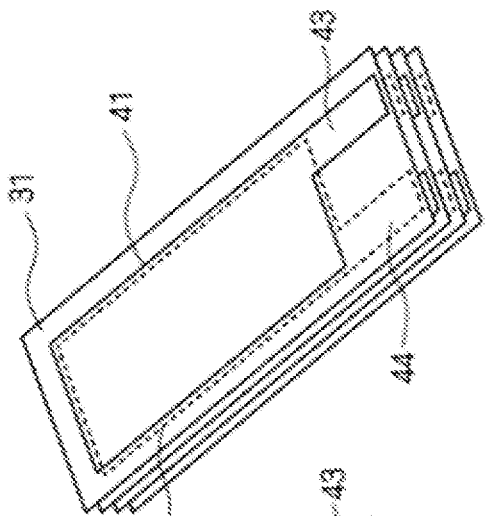
FIGS. 2(a) to 2(c) are schematic perspective views illustrating a manufacturing process of the actuator device according to Embodiment 1 of the present disclosure.
Figure 2B:
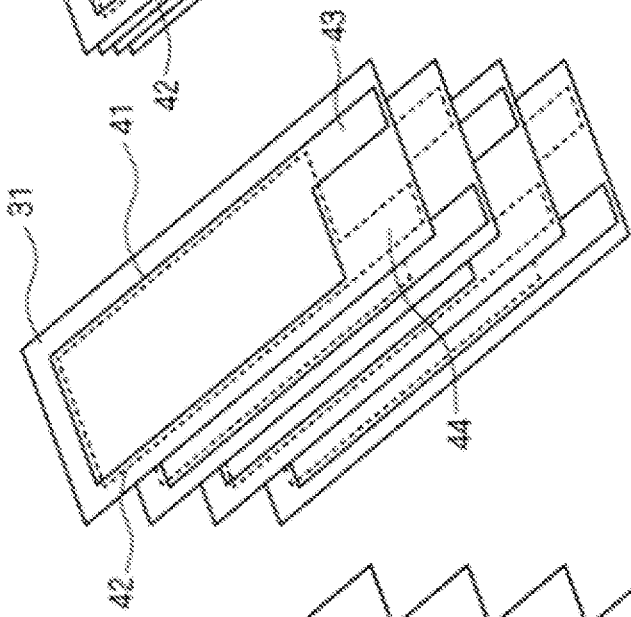
Figure 2A:
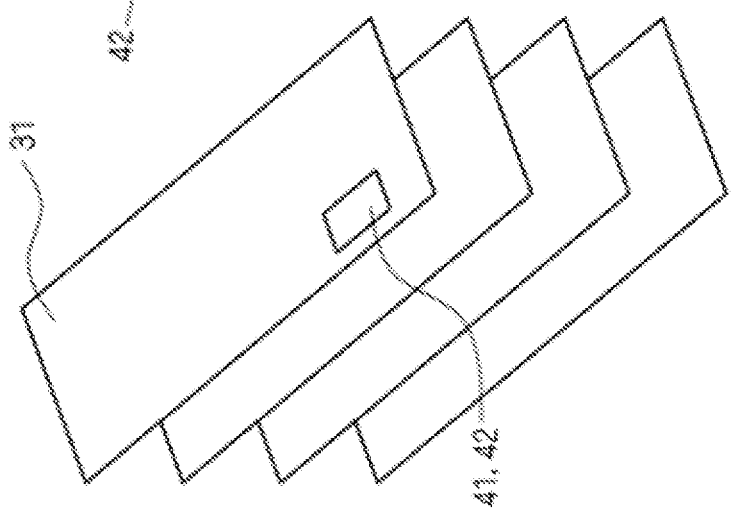

FIGS. 2 and 3 are schematic perspective views illustrating a manufacturing process of the actuator device 10 according to Embodiment 1 of the present disclosure. First, as illustrated in FIG. 2(a), a plurality of the rectangular electrostrictive film (film) 31 made of the high-molecular electrostrictive material are prepared, and the plural sets of conductor patterns 41 and 42 are formed on front and rear surfaces of the electrostrictive films 31, respectively, to manufacture the plural actuator devices 10.

The high-molecular electrostrictive material used to form the electrostrictive film 31 is not limited to a particular one insofar as the high-molecular electrostrictive material includes permanent dipoles. Preferable examples of the high-molecular electrostrictive material are PVDF (polyvinylidene fluoride) and PVDF (polyvinylidene fluoride)-based copolymers, including a P(VDF-TrFE-HFP) copolymer and PVDF-based terpolymers, such as P(VDF-TrFE-CFE), P(VDF-TrFE-CTFE), P(VDF-TrFE-CDFE), P(VDF-TrFE-HFA), P(VDF-TrFE-HFP), P(VDF-TrFE-VC) and P(VDF-VF). Here, P denotes poly, VDF denotes vinylidene fluoride, TrFE denotes trifluoroethylene, CFE denotes chlorofluoroethylene, CTFE denotes chlorotrifluoroethylene, CDFE denotes chlorodifluoroethylene, HFA denotes hexafluoroacetone, HFP denotes hexafluoropropylene, VC denotes vinyl chloride, and VF denotes vinyl fluoride.

In particular, P(VDF-TrFE-CFE) capable of producing relatively large electrostriction is preferable. Although a thickness of the electrostrictive film 31 can be set as required, it is preferably about several μm to 100 μm, for example.

In more detail, the electrostrictive film 31 is formed as a film having a thickness of about several μm to 100 μm, and the conductor patterns (inner electrodes) 41 and 42 are formed on the front and rear surfaces of the electrostrictive film 31, respectively, by spraying conductive ink through masks. The method of forming the conductor patterns 41 and 42 may be changed as required to another suitable one, such as the ink jet method, brush painting, or screen printing, though depending on viscosity of the conductive ink.

The conductive ink used here is prepared by dissolving, in a solvent, an organic conductive material, e.g., PEDOT (polyethylenedioxythiophene), PPy (polypyrrole) or PANI (polyaniline) together with an organic binder. The organic binder may be, for example, a gelatin-based binder, acrylic-based binder, or polyvinyl alcohol-based binder. The solvent may be selected from solvents capable of dissolving the organic binder, e.g., organic conductive materials, such as methanol and ethanol.

Next, as illustrated in FIG. 2(b), the lead electrodes 43 and 44 are formed such that they are led out from the conductor patterns 41 and 42, respectively, toward the same side including one side of the electrostrictive film 31. It is to be noted that FIG. 2(b) and the subsequent drawings illustrate, in schematic forms, one of the plural sets of conductor patterns 41 and 42, which have been formed in FIG. 2(a), corresponding to one of the plural actuator devices 10. In fact, therefore, a multilayer body is formed through procedures, illustrated in FIG. 2(b) and the subsequent drawings, in the state where the plural sets of conductor patterns 41 and 42 are arrayed as illustrated in FIG. 2(a). The actuator device 10 illustrated in FIG. 1 is then obtained by finally cutting the multilayer body per unit device.

In FIG. 2(b), the lead electrode 43 and the lead electrode 44 have different polarities when the actuator device 10 operates and exhibits its function. The lead electrode 43 and the lead electrode 44 having different polarities are formed to be not overlapped with each other in the stacking direction of the electrostrictive films 31. With such an arrangement, the lead electrode 43 and the lead electrode 44 can be made exposed in a state not contacting with each other. Thus, as illustrated in FIG. 2(c), the lead electrodes 43 and 44 having different polarities can be formed respectively in right and left regions of the same one side of the rectangular electrostrictive film 31.

Next, as illustrated in FIG. 3(a), the plural cut portions 12 are formed in each set of lead electrodes 43 and 44. The cut portions 12 are cut from the divided surface of the actuator device 10 in the direction perpendicular to the stacking direction of the electrostrictive films 31 up to the depth not reaching the conductor patterns 41 and 42. Therefore, when the conductive ink 13 is impregnated into the cut portions 12, the conductive ink 13 will not reach the conductor patterns 41 and 42, and the conductor patterns 41 and 42 are avoided from short-circuiting.

Next, as illustrated in FIG. 3(b), the conductive ink 13 is impregnated into the cut portions 12 by dipping the cut portions 12 in the conductive ink 13. By heat-hardening the conductive ink 13 impregnated into the cut portions 12, the respective sets of lead electrodes 43 and 44 can be interconnected per set in the stacking direction of the electrostrictive films 31, and the outer electrode 14 electrically connected to the corresponding inner electrode (i.e., the conductor pattern 41 or 42) can be reliably formed.

In this Embodiment 1, the conductive ink 13 is further applied to respective end portions of the sets of lead electrodes 43 and 44 to cover the conductive ink 13 seeping out from the cut portions 12 and exposed to the outside. By heat-hardening the conductive ink 13 applied here, the entire end portions of the sets of lead electrodes 43 and 44 can be each constituted to be capable of functioning as the outer electrode 14. A metal paste, e.g., a silver paste, may be applied instead of the conductive ink 13.

According to Embodiment 1, as described above, the actuator device 10 is in the stacked form of the plural rectangular electrostrictive films 31 each of which is made of the electrostrictive material and includes the conductor patterns 41 and 42 formed as the inner electrodes on the front and rear surfaces thereof. The lead electrodes 43 and 44 are formed to be led out respectively from the conductor patterns 41 and 42 toward the same side including one side of the electrostrictive film 31. The plural cut portions 12 are formed in each of the sets of lead electrodes 43 and 44, and the conductive ink 13 is applied to the cut portions 12. By heat-hardening the applied conductive ink 13, the respective sets of lead electrodes 43 and 44 can be interconnected per set in the stacking direction of the electrostrictive films 31, and the outer electrode 14 electrically connected to the corresponding inner electrode (i.e., the conductor pattern 41 or 42) can be reliably formed.

While the plural cut portions 12 are formed in Embodiment 1 described above, at least one cut portion 12 needs to be formed because a cut portion is required so that the outer electrode 14 electrically connected to the corresponding inner electrode (i.e., the conductor pattern 41 or 42) can be formed. However, forming the cut portions 12 in plural number is, of course, preferable for the reason that conductivity characteristics would not be impaired even if the interconnection for each set of lead electrodes 43 and 44 in the stacking direction of the electrostrictive films 31 partially failed.

Embodiment 2

A configuration of an actuator device according to Embodiment 2 of the present disclosure is similar to that of Embodiment 1. Therefore, similar components are denoted by the same reference numbers, and a detailed description of those components is omitted. Embodiment 2 is different from Embodiment 1 in including a holding member that holds the conductive ink 13 to more reliably impregnate the conductive ink 13 into the cut portions 12.

FIGS. 4 and 5 are schematic perspective views illustrating a manufacturing process of the actuator device 10 according to Embodiment 2 of the present disclosure. First, as illustrated in FIG. 4(a), a plurality of the rectangular electrostrictive films (film) 31 made of high-molecular electrostrictive material is prepared, and the plural sets of conductor patterns 41 and 42 are formed on front and rear surfaces of the electrostrictive films 31, respectively, to manufacture the plural actuator devices 10.

In more detail, the electrostrictive film 31 is formed as a film having a thickness of about several µm to 100 µm, and the conductor patterns (inner electrodes) 41 and 42 are formed on the front and rear surfaces of the electrostrictive film 31, respectively, by spraying the conductive ink through masks. The method of forming the conductor patterns 41 and 42 may be changed to another suitable one, such as the ink jet method, brush painting, or screen printing, depending on the viscosity of the conductive ink.

Next, as illustrated in FIG. 4(b), the lead electrodes 43 and 44 are formed such that they are led out from the conductor patterns 41 and 42 toward the same side on one side of the electrostrictive film 31. The lead electrode 43 and the lead electrode 44 have different polarities when the actuator device 10 operates and exhibits its function. The lead electrode 43 and the lead electrode 44 having different polarities are formed to be not overlapped with each other in the stacking direction of the electrostrictive films 31. With such an arrangement, the lead electrode 43 and the lead electrode 44 can be made exposed in a state not contacting with each other.

In Embodiment 2, a holding member 45 made of, e.g., Japanese paper and serving to hold the conductive ink 13 is arranged in overlying relation to each of the lead electrodes 43 and 44 having different polarities between adjacent ones of the plural stacked rectangular electrostrictive films 31. Thus, as illustrated in FIG. 4(b), the holding member 45 is arranged to be positioned on each of the lead electrodes 43 and 44 having different polarities. It is to be noted that, as in Embodiment 1, FIG. 4(b) and the subsequent drawings illustrate, in schematic forms, one of the plural sets of conductor patterns 41 and 42, which have been formed in FIG. 4(a), corresponding to one of the plural actuator devices 10. In fact, therefore, a multilayer body is formed through procedures, illustrated in FIG. 4(b) and the subsequent drawings, in the state where the plural sets of conductor patterns 41 and 42 are arrayed as illustrated in FIG. 4(a).

In FIG. 4(b), the holding members 45 are preferably arranged in contact with an outer periphery of the electrostrictive film 31 on the side where the lead electrodes 43 and 44 are formed, i.e., on the same one side of the rectangular electrostrictive film 31 as in Embodiment 1. The holding members 45 holding the conductive ink 13 function as conductors and exhibit an effect similar to that obtained by increasing the thicknesses of the lead electrodes 43 and 44.

Thus, as illustrated in FIG. 4(c), the lead electrodes 43 and 44 having different polarities can be formed respectively in right and left regions of the same one side of the rectangular electrostrictive film 31. A thickness of each of the lead electrodes 43 and 44 is increased corresponding to the thickness of the holding member 45.

Next, as illustrated in FIG. 5(a), the plural cut portions 12 are formed with each set of lead electrodes 43 and 44 as in Embodiment 1. The cut portions 12 are cut from the divided surface of the actuator device 10 in the direction perpendicular to the stacking direction of the electrostrictive films 31 up to the depth not reaching the conductor patterns 41 and 42. Therefore, when the conductive ink 13 is impregnated into the cut portions 12, the conductive ink 13 will not reach the conductor patterns 41 and 42, and the conductor patterns 41 and 42 avoid short-circuiting. In addition, since the lead electrodes 43 and 44 have the larger thicknesses than those in Embodiment 1, the cut portions 12 can be formed more easily.

Next, as illustrated in FIG. 5(b), the conductive ink 13 is impregnated into the cut portions 12 by dipping the cut portions 12 in the conductive ink 13. By heat-hardening the conductive ink 13 impregnated into the cut portions 12, the respective sets of lead electrodes 43 and 44 can be interconnected per set in the stacking direction of the electrostrictive films 31, and the outer electrode 14 electrically connected to the corresponding inner electrode (i.e., the conductor pattern 41 or 42) can be reliably formed. Furthermore, even if the interconnection for each set of lead electrodes 43 and 44 in the stacking direction of the electrostrictive films 31 partly failed, the respective sets of lead electrodes 43 and 44 can be reliably interconnected per set in the stacking direction of the electrostrictive films 31 through the holding members 45 that function as conductors.

Also in this Embodiment 2, the conductive ink 13 is further applied to respective end portions of the sets of lead electrodes 43 and 44 to cover the conductive ink 13 seeping out from the cut portions 12 and exposed to the outside. By heat-hardening the conductive ink 13 applied here, the entire end portions of the sets of lead electrodes 43 and 44 can be each constituted to be capable of functioning as the outer electrode 14. A metal paste, e.g., a silver paste, may be applied instead of conductive ink.

According to Embodiment 2, as described above, since the holding member 45 serving to hold the conductive ink 13 is arranged in overlying relation to each of the lead electrodes 43 and 44 having different polarities between adjacent ones of the plural stacked rectangular electrostrictive films 31, the respective sets of lead electrodes 43 and 44 having different polarities can be reliably interconnected per set in the stacking direction of the electrostrictive films 31 through the holding members 45, and the outer electrode 14 electrically connected to the corresponding inner electrode (i.e., the conductor pattern 41 or 42) can be reliably formed. Furthermore, since the holding member 45 is arranged in overlying relation to each of the lead electrodes 43 and 44 having different polarities between adjacent ones of the plural stacked rectangular films, the lead electrodes 43 and having different polarities avoid short-circuiting. In addition, the thicknesses of the lead electrodes 43 and 44 can be increased, and the cut portions 12 can be formed more easily. As a result, a thickness of the outer electrode 14 can be increased, and durability of the outer electrode can be improved.

While the plural cut portions 12 are formed in Embodiment 2 described above, at least one cut portion 12 needs to be formed because it is required that the outer electrode 14 be electrically connected to the corresponding inner electrode (i.e., the conductor pattern 41 or 42). However, forming the cut portions 12 in a plural number is, of course, preferable for the reason that conductivity characteristics would not be impaired even if the interconnection for each set of lead electrodes 43 and 44 in the stacking direction of the electrostrictive films 31 partly failed.

It is needless to say that the present disclosure is not limited to the above-described embodiments, and the present disclosure can be practiced with various modifications, substitutions, and so on without departing from the gist of the disclosure. For instance, while the conductor patterns 41 and 42 are formed respectively on the front and rear surfaces of the electrostrictive film 31 in the above-described manufacturing process of the actuator device 10 according to the present disclosure, the conductor patterns 41 and 42 may be formed on either one surface of each of the electrostrictive films 31, and those electrostrictive films 31 may be stacked one on another. While the conductor patterns 41 and 42 are formed respectively on the front and rear surfaces of the electrostrictive film 31 by employing the conductive ink 13, a metal film of Ni (nickel), Pt (platinum), Pt—Pd (platinum-palladium alloy), Al (aluminum), Au (gold), or Au—Pd (gold-palladium alloy), for example, may be formed instead by, e.g., vapor deposition or sputtering as in the related art.

Moreover, while the lead electrodes 43 and 44 are formed respectively on the front and rear surfaces of the electrostrictive film 31 in Embodiments 1 and 2 described above, the lead electrodes 43 and 44 led out from the conductor patterns 41 and 42 may be formed only on either one surface, e.g., on the front surface of each of the electrostrictive film 31, and those electrostrictive films 31 may be stacked one on another. It is just required that, eventually, the lead electrodes 43 and 44 having different polarities are exposed without contacting with each other.

The invention claimed is:

1. An actuator device comprising:
   a plurality of stacked films, each of the films being made of an electrostrictive material and having an inner electrode formed on at least one of top and bottom surfaces of the respective film,
   a lead electrode provided on the at least one of the top and bottom surfaces of the films where the inner electrodes are respectively formed and leading out respectively from the inner electrodes toward an outside of the films,
   at least one cut portion formed in the lead electrodes, and
   conductive ink applied to the at least one cut portion.

2. The actuator device according to claim 1, wherein the lead electrodes are formed as electrodes having different polarities, the electrodes of different polarities are not overlapped with each other in a stacking direction of the films, and
   the at least one cut portion is formed in each of the lead electrodes having different polarities.

3. The actuator device according to claim 1, wherein the lead electrodes are formed as electrodes having different polarities, and
   a holding member serving to hold the conductive ink is arranged in overlying relation to each of the lead electrodes having different polarities between adjacent ones of the plural stacked films.

4. The actuator device according to claim 3, wherein the holding member is arranged in contact with an outer periphery of the film at a side where the lead electrodes are formed.

5. A manufacturing method for an actuator device, the method comprising the steps of:
   stacking a plurality of films each of which is made of an electrostrictive material and has an inner electrode formed on at least one of top and bottom surfaces of the respective film,
   forming a lead electrode to be provided on the at least one of the top and bottom surfaces of the films where the inner electrodes are respectively formed and to be led out respectively from the inner electrodes toward an outside of the film, forming at least one cut portion in the lead electrode, and applying conductive ink to the at least one cut portion.

6. The manufacturing method for the actuator device according to claim 5, wherein the lead electrodes are formed as electrodes having different polarities, the electrodes of different polarities are not overlapped with each other in a stacking direction of the films, and the cut portion is formed in each of the lead electrodes having different polarities.

7. The manufacturing method for the actuator device according to claim 5, wherein a holding member serving to hold the conductive ink is arranged in overlying relation to each of the lead electrodes between adjacent ones of the plural stacked films.

8. The manufacturing method for the actuator device according to claim 7, wherein the holding member is arranged in contact with an outer periphery of the film at a side where the lead electrodes are formed.

\* \* \* \* \*